(12) United States Patent
Raghavan et al.

(10) Patent No.: US 7,821,866 B1
(45) Date of Patent: *Oct. 26, 2010

(54) LOW IMPEDANCE COLUMN MULTIPLEXER CIRCUIT AND METHOD

(75) Inventors: Vijay Kumar Srinivasa Raghavan, Colorado Springs, CO (US); Ryan Hirose, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 11/985,206

(22) Filed: Nov. 14, 2007

(51) Int. Cl.
   *G11C 8/00* (2006.01)
(52) U.S. Cl. .................. 365/230.06; 365/205; 327/589
(58) Field of Classification Search .................. 365/203, 365/205, 230.06; 327/589
   See application file for complete search history.

(56) References Cited

U.S. PATENT DOCUMENTS

| | | |
|---|---|---|
| 4,433,257 A | 2/1984 | Kinoshita |
| 4,644,189 A | 2/1987 | Gabillard |
| 4,737,670 A | 4/1988 | Chan |
| 4,803,665 A | 2/1989 | Kasa |
| 4,807,191 A | 2/1989 | Flannagan |
| 4,849,937 A | 7/1989 | Yoshimoto |
| 5,059,825 A | 10/1991 | Yoshida |
| 5,062,082 A | 10/1991 | Choi |
| 5,083,294 A | 1/1992 | Okajima |
| 5,157,283 A | 10/1992 | Kin |
| 5,214,606 A | 5/1993 | Hashimoto |
| 5,216,290 A | 6/1993 | Childers |
| 5,233,559 A | 8/1993 | Brennan, Jr. |
| 5,267,205 A | 11/1993 | Hamada |
| 5,357,479 A | 10/1994 | Matsui |
| 5,376,829 A | 12/1994 | Rogers et al. |
| 5,391,941 A | 2/1995 | Landry |
| 5,493,241 A | 2/1996 | Landry et al. |
| 5,598,114 A | 1/1997 | Jamshidi |
| 5,701,095 A | 12/1997 | Ohsawa |
| 5,731,725 A | 3/1998 | Rothenberger et al. |
| 5,844,840 A | 12/1998 | Le et al. |
| 5,982,220 A | 11/1999 | Kim |

(Continued)

FOREIGN PATENT DOCUMENTS

DE    0314034 A1    10/1988

OTHER PUBLICATIONS

USPTO Notice of Allowance for U.S. Appl. No. 11/566,767 dated Sep. 11, 2008; 3 pages.

(Continued)

*Primary Examiner*—Hoai V Ho

(57) ABSTRACT

The invention has a bootstrapped high voltage pass gate transistor that couples the low voltage sense amplifier to the bitlines. Since the pass gate transistor is bootstrapped its gate floats to the high voltage of the power supply (VCC) plus a delta voltage. This overdrives the pass gate transistor and allows it to pass signals between the sense amplifier and the bitlines with low impedance. This results in good sense differential margins and fast read speeds. The circuit has a pass gate control circuit that places a negative high voltage signal on the gate of the pass gate during non-volatile write operations. This causes the pass gate to isolate the low voltage circuit from the high voltage circuits during this operation. Finally, the circuit is smaller than earlier column multiplexer circuits.

20 Claims, 2 Drawing Sheets

U.S. PATENT DOCUMENTS

| | | | |
|---|---|---|---|
| 6,078,513 | A | 6/2000 | Ong et al. |
| 6,137,340 | A | 10/2000 | Goodell et al. |
| 6,194,950 | B1 | 2/2001 | Kibar et al. |
| 6,211,722 | B1 | 4/2001 | Mattia et al. |
| 6,239,646 | B1 | 5/2001 | Navabi et al. |
| 6,404,237 | B1 | 6/2002 | Mathew et al. |
| 6,486,712 | B1 | 11/2002 | Landry et al. |
| 6,501,324 | B2 | 12/2002 | Ruegg et al. |
| 6,563,367 | B1 | 5/2003 | Lee |
| 6,636,077 | B1 | 10/2003 | Chang et al. |
| 6,650,167 | B1 | 11/2003 | Benzer et al. |
| 6,696,880 | B2 | 2/2004 | Pan et al. |
| 6,819,141 | B1 | 11/2004 | Qi et al. |
| 6,853,233 | B1 | 2/2005 | Terletzki et al. |
| 6,859,391 | B1 * | 2/2005 | Combe et al. .......... 365/185.05 |
| 6,879,191 | B2 | 4/2005 | Davis |
| 6,956,411 | B1 | 10/2005 | Holloway |
| 6,970,116 | B2 | 11/2005 | Masaki |
| 7,030,684 | B2 | 4/2006 | Kim |
| 7,099,200 | B2 * | 8/2006 | Sakui .................... 365/185.33 |
| 7,471,135 | B2 | 12/2008 | Raghavan et al. |

OTHER PUBLICATIONS

USPTO Notice of Allowance for U.S. Appl. No. 11/566,767 dated Aug. 15, 2008; 6 pages.

USPTO Non Final Rejection for U.S. Appl. No. 11/566,767 dated Mar. 11, 2008; 6 pages.

International Search Report and Written Opinion of the International Searching Authority for International Application No. PCT/US2007/085838 mailed Jun. 18, 2008; 11 pages.

USPTO Notice of Allowance for U.S. Appl. No. 09/182,556 dated Jan. 26, 2001; 3 pages.

USPTO Non-Final Rejection for U.S. Appl. No. 09/182,556 dated Sep. 8, 2000; 7 pages.

USPTO Final Rejection for U.S. Appl. No. 09/182,556 dated May 23, 2000; 8 pages.

USPTO Non-Final Rejection for U.S. Appl. No. 09/182,556 dated Jan. 6, 2000; 7 pages.

USPTO Notice of Allowance for U.S. Appl. No. 09/740,106 dated Jul. 1, 2002; 3 pages.

USPTO Non-Final Rejection for U.S. Appl. No. 09/740,106 dated Feb. 27 2000; 6 pages.

USPTO Notice of Allowance for U.S. Appl. No. 08/340,252 dated Aug. 8, 1995; 1 page.

USPTO Non-Final Rejection for U.S. Appl. No. 08/340,252 dated Apr. 20, 1995; 3 pages.

Fitzgerald el al., "Memory System with High-Performance Word Redundancy," IMB Technical Disclosure Bulletin, Oct. 1976, vol. 19, No. 5, pp. 1638-1639; 2 pages.

USPTO Notice of Allowance for U.S. Appl. No. 08/126,069 dated Jul. 27, 1994; 5 pages.

* cited by examiner

LOW IMPEDANCE COLUMN MULTIPLEXER CIRCUIT AND METHOD

RELATED APPLICATIONS

Not applicable

STATEMENT REGARDING FEDERALLY SPONSORED RESEARCH

Not Applicable

THE NAMES OF THE PARTIES TO A JOINT RESEARCH AGREEMENT

Not applicable

REFERENCE TO A SEQUENCE LISTING, A TABLE, OR A COMPUTER PROGRAM LISTING

Not applicable

BACKGROUND OF THE INVENTION

Non-volatile memories require a column multiplexer that can pass read bias voltages onto the bitlines for generating read currents through the memory cell. The column multiplexer is also required to withstand high voltages because the bitlines get high voltage biases during program/erase non-volatile operations. In state of the art technologies, the power supply is also very low (typically less than 1.8v). Since the pass device of the column multiplexer device has to withstand high voltages (around 10V), they have to be thick oxide devices which have high threshold voltages. Due to the high threshold voltages of the high voltage devices and limited power supply headroom, column multiplexers have difficulty passing the read bias voltage onto the bitlines to generate sufficient read currents. As a result, the speed across the column multiplexer is degraded due to high voltage devices and power supply headroom issues. This is even more critical for large density memories where the bitline resistance and capacitances are high causing speed pushouts. In addition, these thick oxide devices require a large area to increase the read currents, which takes up valuable chip area.

Thus, there exists a need for column multiplexer circuit that has good speed during read operations and has a small footprint.

BRIEF SUMMARY OF INVENTION

The present invention has a bootstrapped high voltage pass gate transistor that couples the low voltage sense amplifier to the bitlines. Since the pass gate transistor is bootstrapped its gate floats to the high voltage of the power supply (VCC) plus a delta voltage. This overdrives the pass gate transistor and allows it to pass signals between the sense amplifier and the bitlines with low impedance. This results in good sense differential margins and fast read speeds. The circuit has a pass gate control circuit that places a negative high voltage signal on the gate of the pass gate during non-volatile write operations. This causes the pass gate to isolate the low voltage circuits from the high voltage circuits during this operation. Finally, the circuit is smaller than earlier column multiplexer circuits, because the headroom and voltage drop issues across the multiplexer are not fixed by increasing the area of the pass devices, but it is fixed by using the bootstrapping effect, and the devices added to create the bootstrapping effect can be minimum-sized devices.

DETAILED DESCRIPTION OF THE INVENTION

The present invention includes a bootstrapped high voltage pass gate transistor that couples the low voltage sense amplifier to the bitlines. Since the pass gate transistor is bootstrapped, its gate floats to the high voltage of the power supply (VCC) plus a delta voltage. This overdrives the pass gate transistor and allows it to pass signals between the sense amplifier and the bitlines with low impedance. This results in good sense differential margins and fast read speeds.

Figure 1:
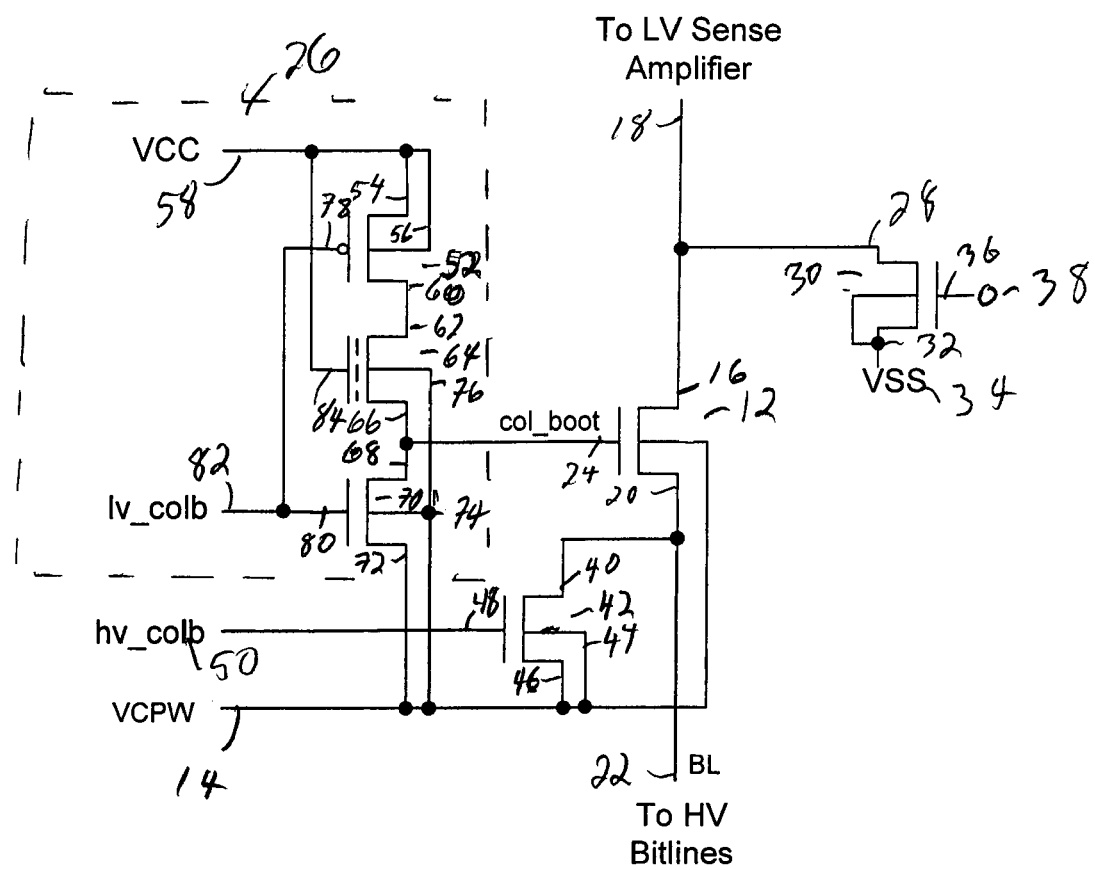
FIG. 1 is a circuit diagram of a low impedance column multiplexer circuit in accordance with one embodiment of the invention.

FIG. 1 is a circuit diagram of a low impedance column multiplexer circuit 10 in accordance with one embodiment of the invention. The circuit 10 includes a high voltage pass gate transistor 12. Note as used herein "high voltage" device means a thick oxide device, and "low voltage" device means a thin oxide device. Naturally these terms are relative, but these are the terms used by those skilled in the art to describe devices that have different threshold and operating voltages, and, therefore, would be understood by these skilled artisans. The pass gate transistor 12 comprises a NMOS device. The body of the pass transistor 12 is coupled to the non-volatile write control signal (VCPW) 14. The drain 16 of the pass transistor 12 is coupled to the sense amplifier line 18. The source 20 of the pass gate 12 is coupled to the bitlines 22. The gate 24 of the pass gate transistor 12 forms the node col_boot, which is coupled to the pass gate control circuit 26. The drain 16 of the pass gate transistor 12 is coupled to the drain 28 of a low voltage transistor 30. The low voltage transistor 30 is a NMOS device. The body and the source 32 of the low voltage transistor 30 are coupled to the low voltage of the power supply (VSS) 34. The gate 36 of the low voltage transistor 30 is coupled to a reset signal 38. The source 20 of the pass gate 12 is coupled to a drain 40 of a high voltage reset transistor 42. The high voltage reset transistor 42 comprises a NMOS device. The body 44 and the source 46 of the high voltage transistor 42 are coupled to the non-volatile write control signal (VCPW) 14. The gate 48 of the high voltage reset transistor 42 is coupled to the high voltage column control signal (hv_colb) 50.

The pass gate control circuit 26 includes a high voltage transistor 52 with a source 54 and body 56 coupled to the high voltage of the power supply (VCC) 58. The high voltage transistor 52 comprises a PMOS device. The drain 60 of the high voltage transistor 52 is coupled to the drain 62 of the native high voltage transistor 64. The native high voltage transistor 64 comprises a NMOS device with about zero threshold voltage. The source 66 of the native transistor 64 is coupled to the drain 68 of a second high voltage transistor 70 and to the gate 24 of the pass transistor 12. The second high voltage transistor 70 comprises a NMOS device. The source 72 of the second high voltage transistor 70 is coupled to the non-volatile write control signal (VCPW) 14. The body 74 of the second high voltage transistor 70 and the body 76 of the native transistor 64 are coupled to the non-volatile write control signal (VCPW) 14. The gate 78 of the first high voltage transistor 52 and the gate 80 of the second high voltage transistor 70 are coupled to the low voltage column control signal 82 (lv_colb). The gate 84 of the native transistor 64 is coupled to the high voltage of the power supply (VCC) 58.

During a normal read operation, the non-volatile write control signal (VCPW) 14 input is set to low voltage of the power supply VSS. The low voltage column control signal 82 (i.e., the column is deselected) is at VCC (the high voltage of the power supply) and the high voltage column controls signal 50 (hv_colb) is at VCC at the start of the cycle. The node 24 (col_boot) is discharged to VSS through the second high voltage transistor 70. Also, the reset signal 38 is coupled to VCC. The node BL 22 is pulled to VSS through the high voltage reset transistor 42 and sense amplifier line 18 is pulled to VSS through low voltage transistor 30. This ensures the leakage current through the SONOS memory cells that are coupled to the bitlines (that is referenced to VSS) is zero for unselected columns. This helps in meeting stringent standby current specifications.

The column is selected by setting the reset signal 38 to VCC, driving the low voltage column control signal input (lv_colb) 82 to VSS, and driving the high voltage column control signal (hv_colb) 50 to VSS. When the column is selected, the node 24 (col_boot) becomes charged close to VCC through the native transistor, which has threshold voltage of almost zero (Vt~0V), and the high voltage transistor 52. This turns on the pass gate transistor 12. After the node 24 (col_boot) is pre-charged to VCC, the reset signal is driven to VSS. At the same time, the LV current sense amplifier coupled to 18 is turned on. This establishes a current path from VCC to VSS from the sense amplifier side 18 through the pass gate 12 to the bitline (BL) 22 side of the memory cell. Whenever a path to VCC is established to the column multiplexer through the sense amplifier side 18, the low voltage transistor is turned off (reset signal 38 is VSS). The node 22 BL starts to rise from VSS. If the bitline node 22 rises by, for example, delta volts, then the node 24 (col_boot) rises to VCC+delta due to bootstrapping effect across the pass gate 12. This ensures that the pass gate 12 (which has a high Vt due to its thick gate oxide) gate is over-driven, and, hence, BL 22 is able to rise higher than what it would have risen with the node 24 (col_boot) tied to just VCC. Since the gate 24 of the pass gate 12 is over-driven by the bootstrapping effect, the node BL 22 is able to reach much higher than what it would have reached without the bootstrap. This gives more erase current through an erased memory cell, and, hence, better read erase sense differential margin and speed.

When the column is deselected, then the low voltage column control signal (lv_colb) 82 and the high voltage column control signal (hv_colb) 50 are driven to VCC. This causes node 24 (col_boot) to quickly discharge to VSS through the second high voltage transistor 70. This turns off the pass gate 12 and the BL 22 is discharged to VSS through the high voltage reset transistor 42.

In case of successive reads on the same column (i.e., the same column select is ON for successive read cycles), there is a possibility at extreme corners that the node 24 (col_boot) will discharge due to diffusion junction leakage from VCC+delta back to VCC over time while a read operation is being performed. This will degrade the voltage level on the BL 22, which will cause lower erase currents. To prevent this, the node 18 is always brought back to VSS through the low voltage transistor 30 after every read access. When node 18 goes to VSS the BL 22 also go to VSS. This makes sure that any read access, even if it were successive reads on the same column, causes the nodes 18 & 22 to go to VSS and then charge back towards VCC through the devices in the sense amplifier. This ensures that the node 24 (col_boot) will get a bootstrapping effect at the start of a read cycle. The node 18 discharges to VSS after every read access and is controlled by the low voltage transistor 30. The gate 36 of the low voltage transistor 30 is coupled to the reset signal 38 which is controlled by the sense amplifier timing signals such that once the read data has been sensed and latched, the node 18 is discharged back to VSS before the start of the next read cycle.

During non-volatile write operations, a high voltage (negative voltages below VSS or positive voltages above VCC) signal is set to the bitline BL 22 through page latch circuitry (not shown in the figure). When this is being done, the node BL 22 sees high voltages. In order to isolate the low voltage side 18 (which connects to low voltage circuits in the sense amplifier) of the column multiplexer from the high voltages, the low voltage column control signal 82 is driven to VCC and the non-volatile write control signal (VCPW) 14 is driven to the negative high voltage. This charges the node 24 (col_boot) to the negative high voltage from the non-volatile write control signal (VCPW) 14. This turns off the pass gate 12 and isolates the low voltage side from the high voltage side. The high voltage column control signal 50 (hv_colb) is also driven to a negative high voltage so that the high voltage reset transistor 42 is off and hence it lets BL 22 to freely get high voltages from the page latch circuitry.

Figure 2:
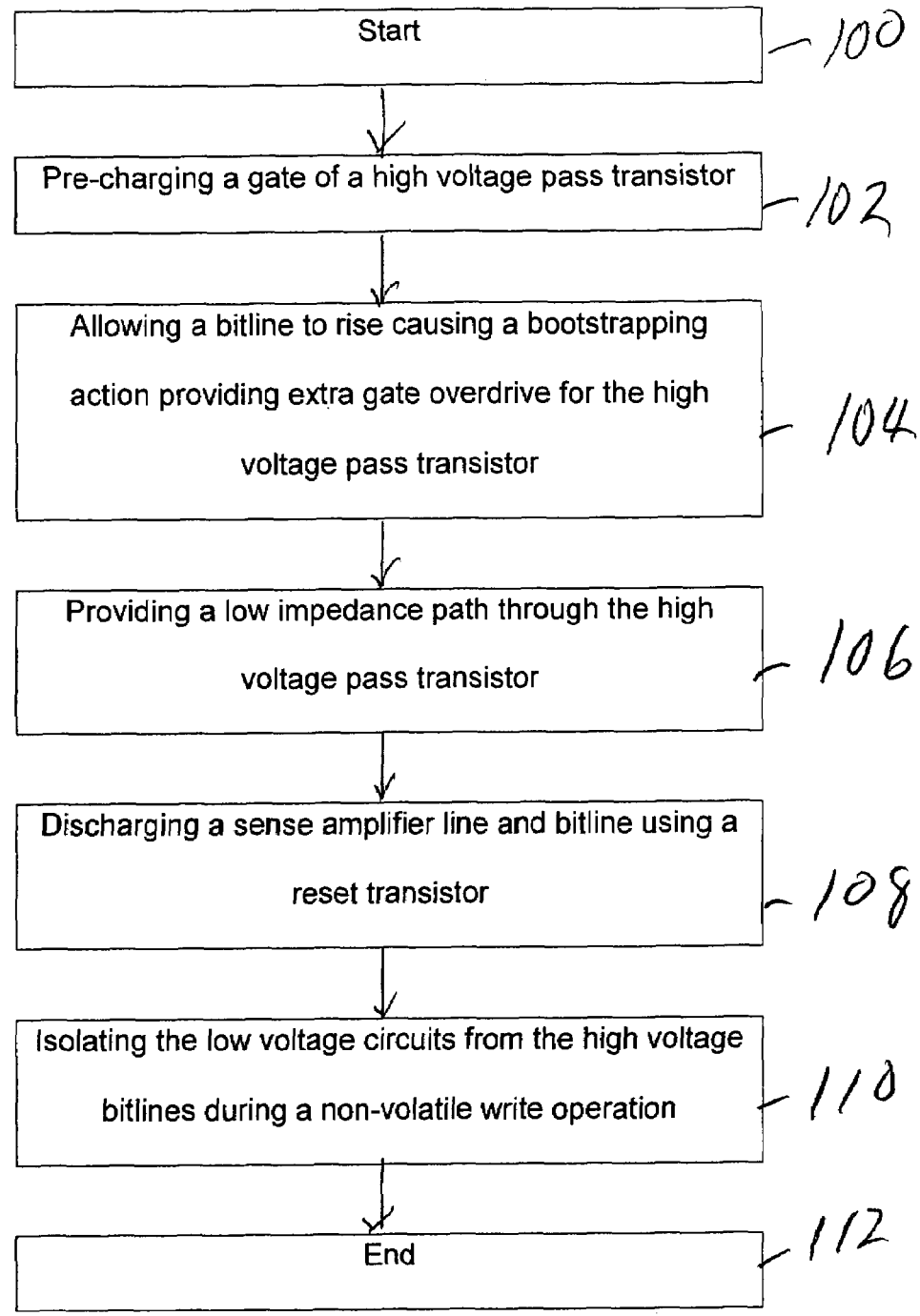
FIG. 2 is a flow chart of a method of operating the low impedance column multiplexer circuit of FIG. 1 in accordance with one embodiment of the invention.

FIG. 2 is a flow chart of a method of operating the low impedance column multiplexer circuit of FIG. 1 in accordance with one embodiment of the invention. The process starts, step 100, by pre-charging a gate 24 of the high voltage pass transistor 12 at step 102. A bitline node 22 is allowed to rise causing a bootstrapping action at step 104. Step 104 provides extra gate overdrive for the high voltage pass transistor. At step 106, a low impedance path through the pass gate transistor 12 is provided. At step 108, the sense amplifier line and the bitline are discharged using a reset transistor. At step 110, isolation of the low voltage circuits from the high voltage bitlines is provided during a non-volatile write operation which ends the process at step 112. [

Before every read cycle, the gate 24 of the pass gate transistor 12 is coupled to the low voltage side of the power supply (VSS). The bitline node 22 is also coupled to the low voltage side of the power supply (VSS) as is the sense amplifier node 18. This is done after or between every read operation.

In a non-volatile write operation, the gate 24 of the pass gate transistor 12 is driven to a high negative voltage. This isolates the high voltage circuitry from the low voltage circuitry.

Thus, there has been described a low impedance column multiplexer circuit that provides a low impedance path, uses less chip area, and isolates the high voltage circuit from the low voltage circuitry.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:
1. A low impedance column multiplexer circuit, comprising:
 a high voltage pass transistor;
 a high voltage native transistor including a source coupled to a gate of the high voltage pass transistor; and
 a high voltage transistor including a source coupled to a high voltage side of a power supply and a drain coupled to a drain of the high voltage native transistor.
2. The circuit of claim 1, wherein a drain of the high voltage pass transistor is coupled to a low voltage sense amplifier.

3. The circuit of claim 2, wherein a source of the high voltage pass transistor is coupled to a high voltage bitline.

4. The circuit of claim 1, wherein a gate of the high voltage native transistor is coupled to the high voltage side of the power supply.

5. The circuit of claim 4, wherein a gate of the high voltage transistor is coupled to a low voltage column control signal.

6. The circuit of claim 5, further including a second high voltage transistor having a gate coupled to the low voltage column signal, a source coupled to a non-volatile write control signal, and a drain coupled to a gate of the high voltage pass transistor.

7. The circuit of claim 5, further including a low voltage transistor having a source coupled to a low voltage side of the power supply, a drain coupled to a drain of the high voltage pass transistor, and a gate coupled to a reset signal.

8. The circuit of claim 7, further including a high voltage reset transistor with a drain coupled to a source of the high voltage pass transistor, a source coupled to the non-volatile write control signal, and a gate coupled to a high voltage column control signal.

9. A low impedance column multiplexer circuit, comprising:
   a high voltage bootstrapped pass transistor;
   a low voltage reset transistor including a drain coupled to a drain of the high voltage bootstrapped pass transistor; and
   a pass gate control circuit including an output coupled to the gate of the high voltage bootstrapped pass transistor, wherein the pass gate control circuit is configured to overdrive the high voltage bootstrapped pass transistor.

10. The circuit of claim 9, wherein the drain of the high voltage bootstrapped pass transistor is coupled to a sense amplifier.

11. The circuit of claim 10, wherein a source of the high voltage bootstrapped pass transistor is coupled to a bitline.

12. The circuit of claim 9, wherein the pass gate control circuit includes a high voltage native transistor with a course coupled to a gate of the high voltage bootstrapped pass transistor and a gate coupled to a high voltage side of a power supply.

13. The circuit of claim 12, further including a high voltage transistor having a drain coupled to a drain of the high voltage native transistor and a source coupled to the high voltage side of the power supply.

14. The circuit of claim 13, further including a second high voltage transistor having a source coupled to a non-volatile write control signal, a drain coupled to the gate of the high voltage bootstrapped pass transistor, and a gate coupled to a low voltage column control signal.

15. A method of operating a low impedance column multiplexer circuit, comprising the steps of:
   pre-charging a gate of a high voltage pass transistor;
   generating a bootstrap action by allowing a bitline to rise;
   providing a low impedance path through the high voltage pass transistor;
   resetting sense amplifier line and bitline; and
   providing an isolation of low voltage circuits from high voltage bitlines during a non-volatile write operation.

16. The method of claim 15, wherein the steps preceding the pre-charging of the gate of the high voltage pass transistor, including the steps of:
   coupling the gate of the high voltage pass transistor to a low voltage side of a power supply;
   coupling the bitline to the low voltage side of the power supply.

17. The method of claim 16, further including the step of:
   coupling a sense amplifier line to the low voltage side of the power supply.

18. The method of claim 15, wherein the step of generating the bootstrap action creates additional gate overdrive for the high voltage pass transistor.

19. The method of claim 15, wherein the step of resetting the sense amplifier line and bitline includes the step of:
   determining if a read operation is complete;
   when the read operation is complete, coupling the sense amplifier line and the bitline to the low voltage side of the power supply.

20. The method of claim 15, wherein the step of providing an isolation of the low voltage circuits from the high voltage bitlines during a non-volatile write operation includes the steps of:
   determining if a non-volatile write operation is to be performed;
   when the non-volatile write operation is to be performed, driving the gate of the high voltage pass transistor to a negative high voltage.

* * * * *